United States Patent
Kim

(10) Patent No.: US 7,259,595 B2
(45) Date of Patent: Aug. 21, 2007

(54) CIRCUIT AND METHOD FOR DETECTING FREQUENCY OF CLOCK SIGNAL AND LATENCY SIGNAL GENERATION CIRCUIT OF SEMICONDUCTOR MEMORY DEVICE WITH THE CIRCUIT

(75) Inventor: Myeong-O Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 11/120,804

(22) Filed: May 2, 2005

(65) Prior Publication Data

US 2005/0270890 A1    Dec. 8, 2005

(30) Foreign Application Priority Data

Jun. 3, 2004    (KR) ............... 10-2004-0040326

(51) Int. Cl.
    *G01R 23/02*    (2006.01)
(52) U.S. Cl. ............... 327/39; 327/47; 327/49
(58) Field of Classification Search ........... 327/39, 327/47, 49
    See application file for complete search history.

(56) References Cited

U.S. PATENT DOCUMENTS

| 5,926,042 | A | * | 7/1999 | Talaga, Jr. ............. 327/45 |
| 6,055,210 | A | | 4/2000 | Setogawa |
| 6,911,873 | B2 | * | 6/2005 | Yin et al. ............. 331/74 |
| 7,134,042 | B2 | * | 11/2006 | Shimasaki ............. 714/4 |

2003/0223293 A1    12/2003    Kawaguchi et al.

FOREIGN PATENT DOCUMENTS

| KR | 1998-022533 | 7/1998 |
| KR | 1999-0039594 | 6/1999 |
| KR | 2000-0038480 | 7/2000 |
| KR | 2001-0036041 | 5/2001 |
| KR | 2003-0037673 | 5/2003 |
| KR | 2003-0056461 | 7/2003 |

OTHER PUBLICATIONS

English language abstract of Korea Publication No. 1998-022533.
English language abstract of Korea Publication No. 1999-0039594.
English language abstract of Korea Publication No. 2000-0038480.
English language abstract of Korean Publication No. 2001-0036041.
English language abstract of Korean Publication No. 2003-0037673.
English language abstract of Korean Publication No. 2003-0056461.

* cited by examiner

*Primary Examiner*—Kenneth B. Wells
(74) *Attorney, Agent, or Firm*—MargerJohnson & McCollom, P.C.

(57) ABSTRACT

A frequency detection circuit and method of detecting the frequency of a clock signal, and a latency signal generation circuit for a semiconductor memory device that includes the frequency detection circuit. The frequency detection circuit includes a frequency detector and an output controller, which determines whether or not the frequency of the clock signal is higher than a predetermined value. Embodiments of the invention have an increased accuracy, increased efficiency, and a reduced current consumption over conventional art.

21 Claims, 10 Drawing Sheets

CIRCUIT AND METHOD FOR DETECTING FREQUENCY OF CLOCK SIGNAL AND LATENCY SIGNAL GENERATION CIRCUIT OF SEMICONDUCTOR MEMORY DEVICE WITH THE CIRCUIT

BACKGROUND OF THE INVENTION

This application claims the priority of Korean Patent Application No. 2004-40326, filed on Jun. 3, 2004, in the Korean Intellectual Property Office, the disclosure of which is incorporated herein in its entirety by reference.

1. Field

The disclosure relates to a semiconductor memory device, and more particularly, to a frequency detection circuit to detect the frequency of a clock signal and a latency signal generation circuit having the same.

2. Description of the Related Art

Generally, a synchronous dynamic random access memory (SDRAM) reads data from a memory cell or writes data in to the memory cell in response to an external read command or write command that is received in synchronization with an external clock signal. For example, data is transmitted between the SDRAM and a memory controller through an input/output (I/O) interface in which data is synchronized with a clock signal and transmitted. As transmission frequency increases, it becomes more important to precisely synchronize data with the clock signal. To precisely synchronize data with the clock signal, a conventional SDRAM includes an internal clock signal generator, which generates an internal clock signal and provides the internal clock signal to individual components. The foregoing conventional SDRAM is disclosed in U.S. Pat. No. 6,055,210.

After receiving the read command, the SDRAM outputs data read from the memory cell after a predetermined number of clock cycles. The predetermined number of clock cycles is typically referred to as a latency number. The latency number can be determined according to the operating frequency of the SDRAM. For example, the latency number of an SDRAM having a high operating frequency is set to a higher value than the latency number of an SDRAM having a low operating frequency. Also, the SDRAM includes a latency signal generation circuit, which generates a latency signal. An enabling period of the latency signal is determined according to the predetermined latency number and the length of data to be output (i.e., burst length), and the operation of a data output circuit is controlled by the latency signal. That is, the data output circuit outputs data during the enabling period of the latency signal.

FIG. 1 is a circuit diagram of a data output circuit 10 of a conventional semiconductor memory device.

Referring to FIG. 1, the data output circuit 10 includes a latency signal generation circuit 20, an output controller 30 and an output buffer circuit 40. The output buffer circuit 40 includes an inverter 41, a NAND gate 42, a NOR gate 43, a PMOS transistor 44, and an NMOS transistor 45.

The latency signal generation circuit 20 receives column address strobe (CAS) latency control signals CL1, CL3, and CL4, a read control signal COS, a write control signal PWR, a first internal clock signal DCLK, and a second internal clock signal PCLK, and generates a latency signal LAT. The output controller 30 outputs an output control signal PTRST in response to the latency signal LAT and the first internal clock signal DCLK. The output buffer circuit 40 receives an internal data signal DI and outputs an output data signal DQ in response to the output control signal PTRST.

FIG. 2 is a detailed circuit diagram of the conventional latency signal generation circuit 20 shown in FIG. 1.

Referring to FIG. 2, the latency signal generation circuit 20 includes an input logic circuit 21, an input latch circuit 22, a first switching circuit 23, a second switching circuit 24, a first delay latch circuit 25, a second delay latch circuit 26, and an output logic circuit 27. The first and second switching circuits 23 and 24 are turned on or off in response to the CAS latency control signals CL4 and CL3, respectively. The input latch circuit 22 operates in response to the second internal clock signal PCLK, and the first and second delay latch circuits 25 and 26 operate in response to the first internal clock signal DCLK. That is, the input latch circuit 22 operates only when it receives the second internal clock signal PCLK, and the first and second delay latch circuits 25 and 26 operate only when they receive the first internal clock signal DCLK.

The first internal clock signal DCLK and the second internal clock signal PCLK are generated by a first internal clock signal generator (not shown) and a second internal clock signal generator (not shown), respectively. The first internal clock signal generator is synchronized with an external clock signal EXCLK and sequentially generates the first internal clock signal DCLK while the semiconductor memory device is being enabled. On the other hand, the second internal clock signal generator is synchronized with the external clock signal EXCLK and generates the second internal clock signal PCLK only when the semiconductor memory device externally receives a read command READ. Accordingly, when the semiconductor memory device does not receive the read command READ, the second internal clock signal PCLK is not generated, and the input latch circuit 22 stops operating. At this time, even if the first and second delay latch circuits 25 and 26 receive the first internal clock signal DCLK, since the first and second switching circuits 23 and 24 are turned off, the first and second delay latch circuits 25 and 26 cannot receive any signals and thus, also stop operating. As a result, since the operation of the latency signal generation circuit 20 is stopped while the read command READ is not received, the current used by the latency signal generation circuit 20 may be reduced. The latency signal generation circuit 20, which is embodied so that the input latch circuit 22 operates in response to the second internal clock signal PCLK, operates more preferably when the frequency of the external clock signal EXCLK is reduced. However, as the frequency of the external clock signal EXCLK increases, the likelihood of malfunction of the latency signal generation circuit 20 increases. More specifically, as the frequency of the external clock signal EXCLK increases, the operating speed of the latency signal generation circuit 20 should be increased in proportion to the frequency of the external clock signal EXCLK. However, since the second internal clock signal PCLK is generated after the read command READ is received, the input latch circuit 22 cannot operate at the same time as when the read command READ is received. Thus, the latency signal generation circuit 20 generates a wrong latency signal LAT.

This phenomenon will be described in detail with reference to FIG. 3, which is a timing chart showing input and output signals of the latency signal generation circuit 20 shown in FIG. 2. FIG. 3 exemplarily illustrates a case where the CAS latency control signal CL4 is enabled and the first switching circuit 23 is turned on. The input latch circuit 22 latches an initial input signal LAT0 during a low level period of the second internal clock signal PCLK and outputs the initial input signal LAT0 as a latch signal LAT3 in synchronization with a rising edge of the second internal clock signal PCLK. Similarly, the first delay latch circuit 25 latches the latch signal LAT3 during a low level period of the first internal clock signal DCLK and outputs the latch signal LAT3 as a latch signal LAT4 in synchronization with a rising edge of the first internal clock signal DCLK. Also, the second delay latch circuit 26 latches the latch signal LAT4 during a low level period of the first internal clock signal DCLK and outputs the latch signal LAT4 as a latch signal LATB in synchronization with a rising edge of the first internal clock signal DCLK. However, since the second internal clock signal PCLK is generated after the read command READ is generated, a time margin E from when the first delay latch circuit 25 latches the latch signal LAT3 until the first delay latch circuit 25 outputs the latch signal LAT4 is reduced. As a result, the first delay latch circuit 25 is likely to latch a wrong signal. Referring to FIG. 3, the time margin E required for the latch operation of the first delay latch circuit 25 is even smaller than a time margin D required for the latch operation of the input latch circuit 22 or a time margin F required for the latch operation of the second delay latch circuit 26. This phenomenon becomes more serious with an increase in the frequency of the external clock signal EXCLK.

Meanwhile, to solve these problems, the latency signal generation circuit 20 may be embodied so that all of the input latch circuit 22 and the first and second delay latch circuits 25 and 26 operate in response to the first internal clock signal DCLK. However, in this case, since the input latch circuit 22 sequentially operates during the enabling of the semiconductor memory device irrespective of generation of the read command READ, the current used by the input latch circuit 22 increases. Also, when the latency signal generation circuit 20 operates only in response to the first internal clock signal DCLK when the frequency of the external clock signal EXCLK is low, current is wasted and efficiency is reduced. Therefore, it is required to detect the frequency of the external clock signal EXCLK beforehand so that the latency signal generation circuit can generate a latency signal in response to the result.

SUMMARY OF THE INVENTION

Embodiments of the invention provide a frequency detection circuit, which detects the frequency of a clock signal.

Embodiments of the invention also provide a latency signal generation circuit for a semiconductor memory device, which includes a frequency detection circuit to detect the frequency of a clock signal.

Embodiments of the invention further provide a method of detecting the frequency of a clock signal.

According to an aspect of the invention, there is provided a frequency detection circuit to detect the frequency of a clock signal. The frequency detection circuit includes a frequency detector and an output controller.

The frequency detector divides the clock signal by a predetermined division ratio, detects the frequency of the clock signal based on a divided signal obtained by the division of the clock signal, an inverted signal of the divided signal, and the clock signal, and outputs a first detection signal. The output controller determines whether or not the frequency of the clock signal is higher than a predetermined value, in response to the first detection signal, and outputs a second detection signal as a determination result.

According to another aspect of the invention, there is provided a latency signal generation circuit for a semiconductor memory device, which generates a latency signal to control an enabling period of a data output circuit during a read operation. The latency signal generation circuit includes a latency signal generator, a clock signal selector, and a frequency detection circuit. The latency signal generator generates the latency signal in response to a plurality of control signals, an input clock signal, and a first internal clock signal. The clock signal selector selects either the first internal clock signal or a second internal clock signal in response to a second detection signal and outputs a selected signal as the input clock signal. The frequency detection circuit detects the frequency of an external clock signal and outputs the second detection signal based on a detection result.

According to yet another aspect of the invention, there is provided a method of detecting the frequency of a clock signal. The method includes dividing the clock signal by a predetermined division ratio and outputting a divided signal obtained by the division of the clock signal; detecting the frequency of the clock signal based on the divided signal, an inverted signal of the divided signal, and the clock signal and outputting a first detection signal; and determining whether or not the frequency of the clock signal is higher than a predetermined value in response to the first detection signal and outputting a second detection signal as a determination result.

BRIEF DESCRIPTION OF THE DRAWINGS

The above features and advantages of the invention will become more apparent by describing in detail exemplary embodiments thereof with reference to the attached drawings.

DETAILED DESCRIPTION OF THE INVENTION

Figure 1:
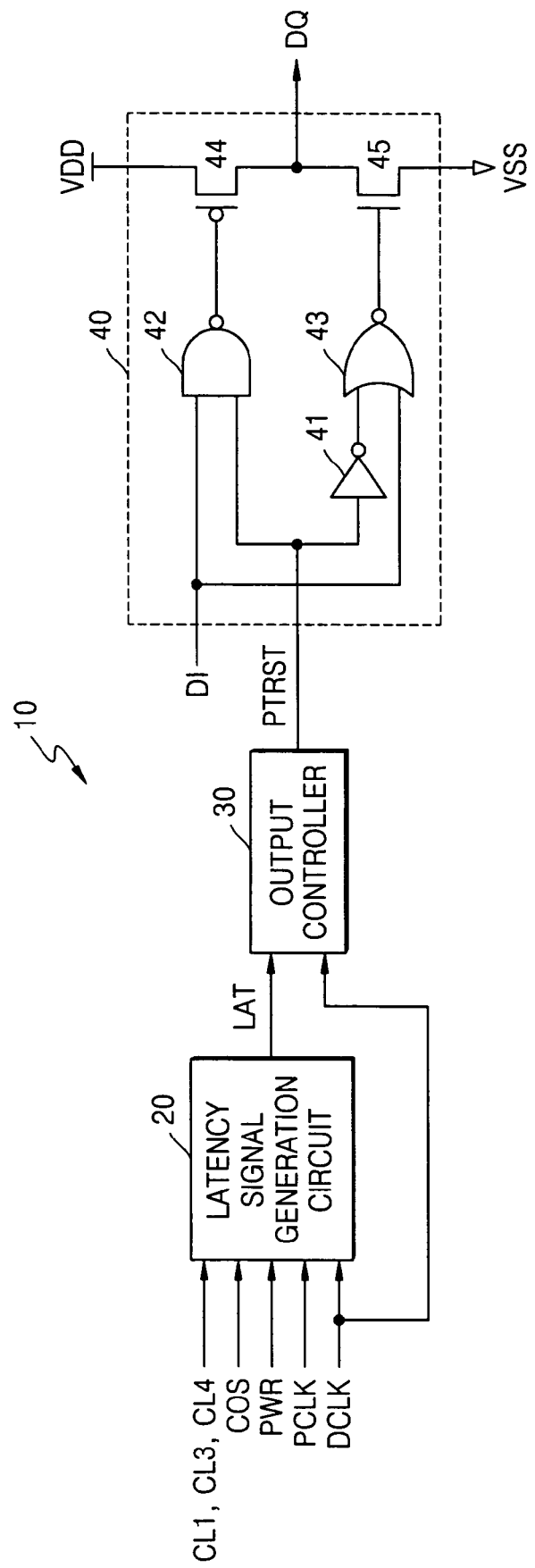
FIG. 1 is a circuit diagram of a data output circuit of a conventional semiconductor memory device.
Figure 2:
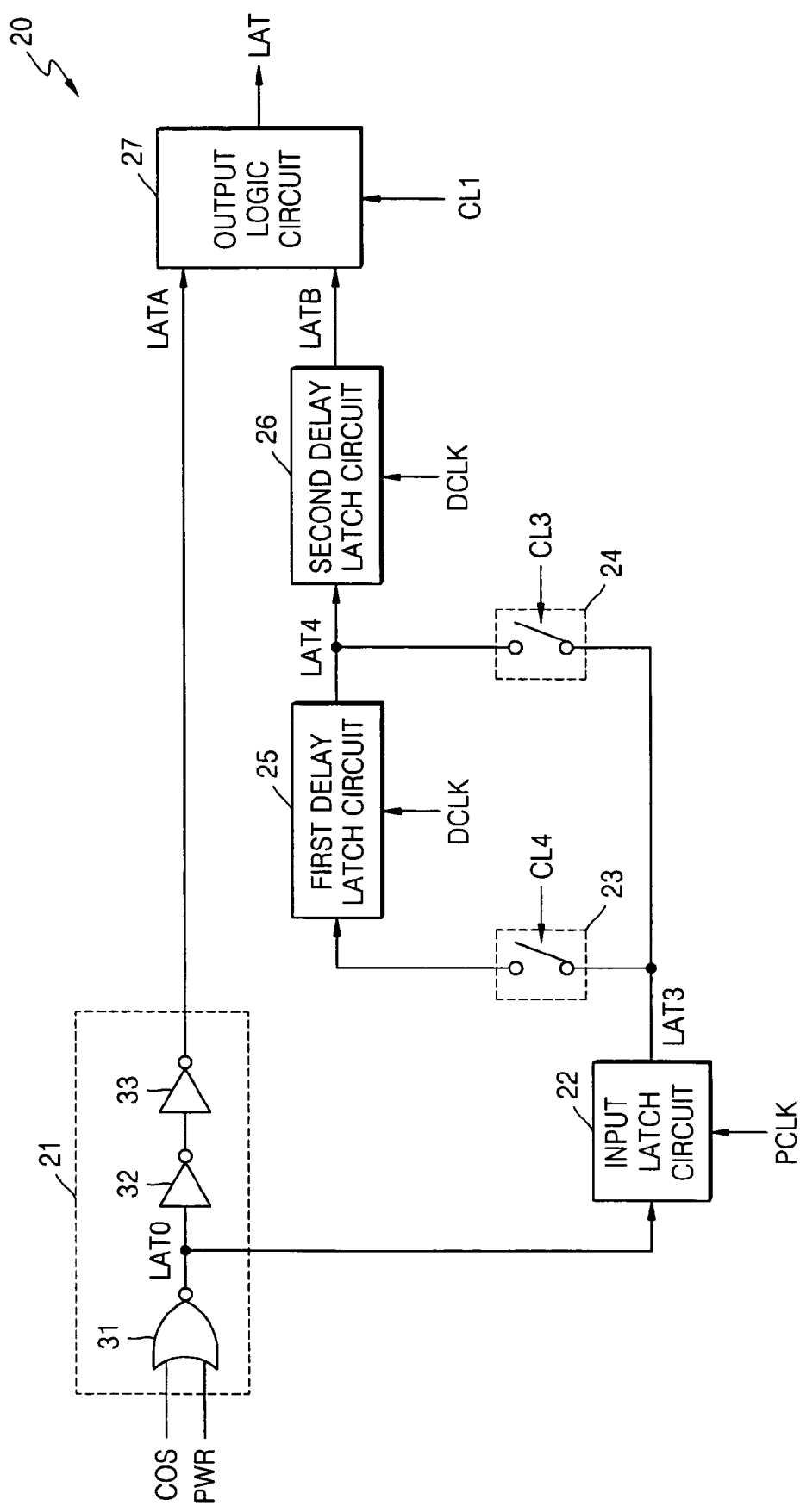
FIG. 2 is a detailed circuit diagram of the conventional latency signal generation circuit shown in FIG. 1.
Figure 3:
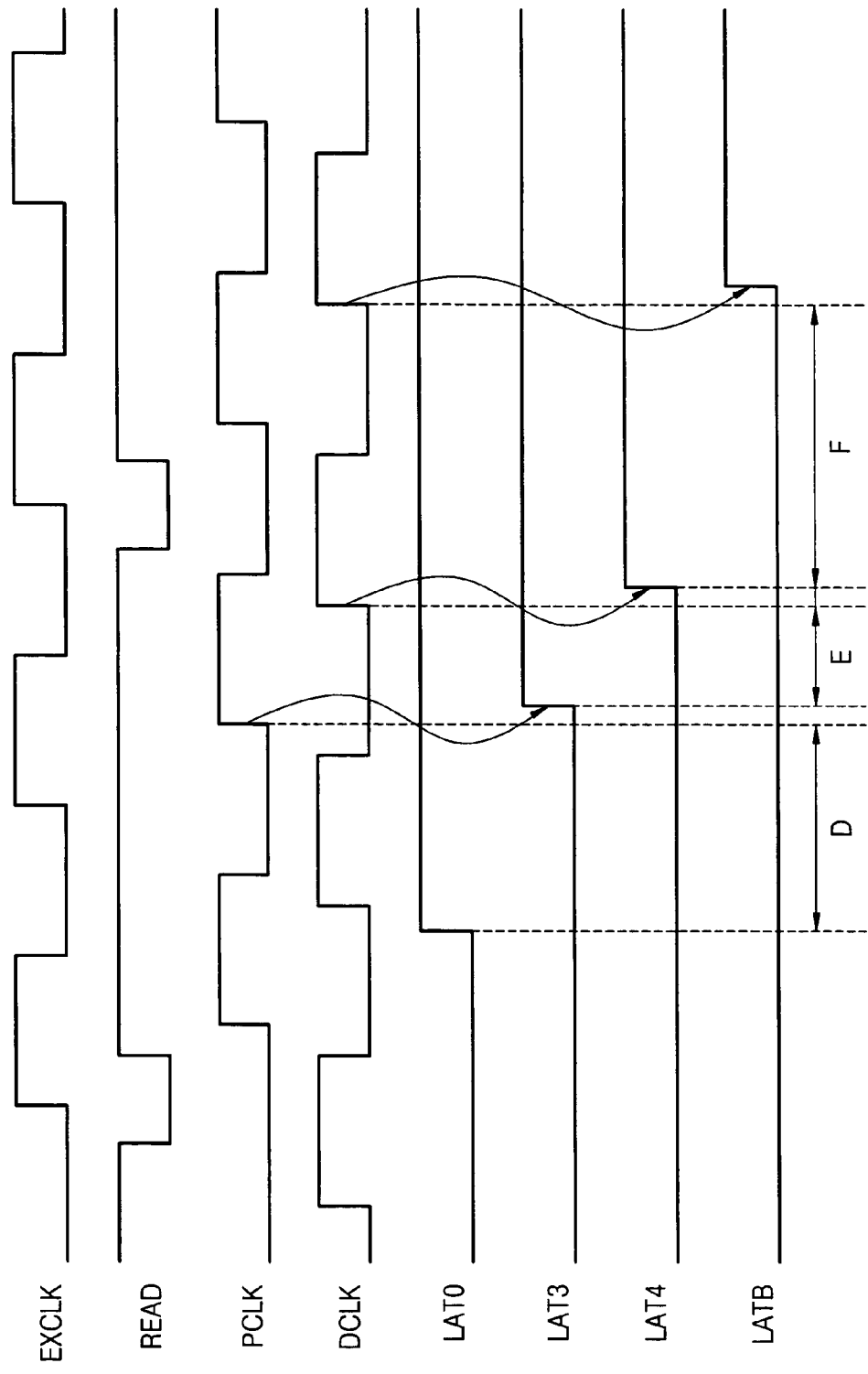
FIG. 3 is a timing chart showing input and output signals of the latency signal generation circuit shown in FIG. 2.

Embodiments of the invention will now be described more fully with reference to the accompanying drawings, in which exemplary embodiments of the invention are shown. The same reference numerals are used to denote the same elements throughout the drawings.

Figure 4:
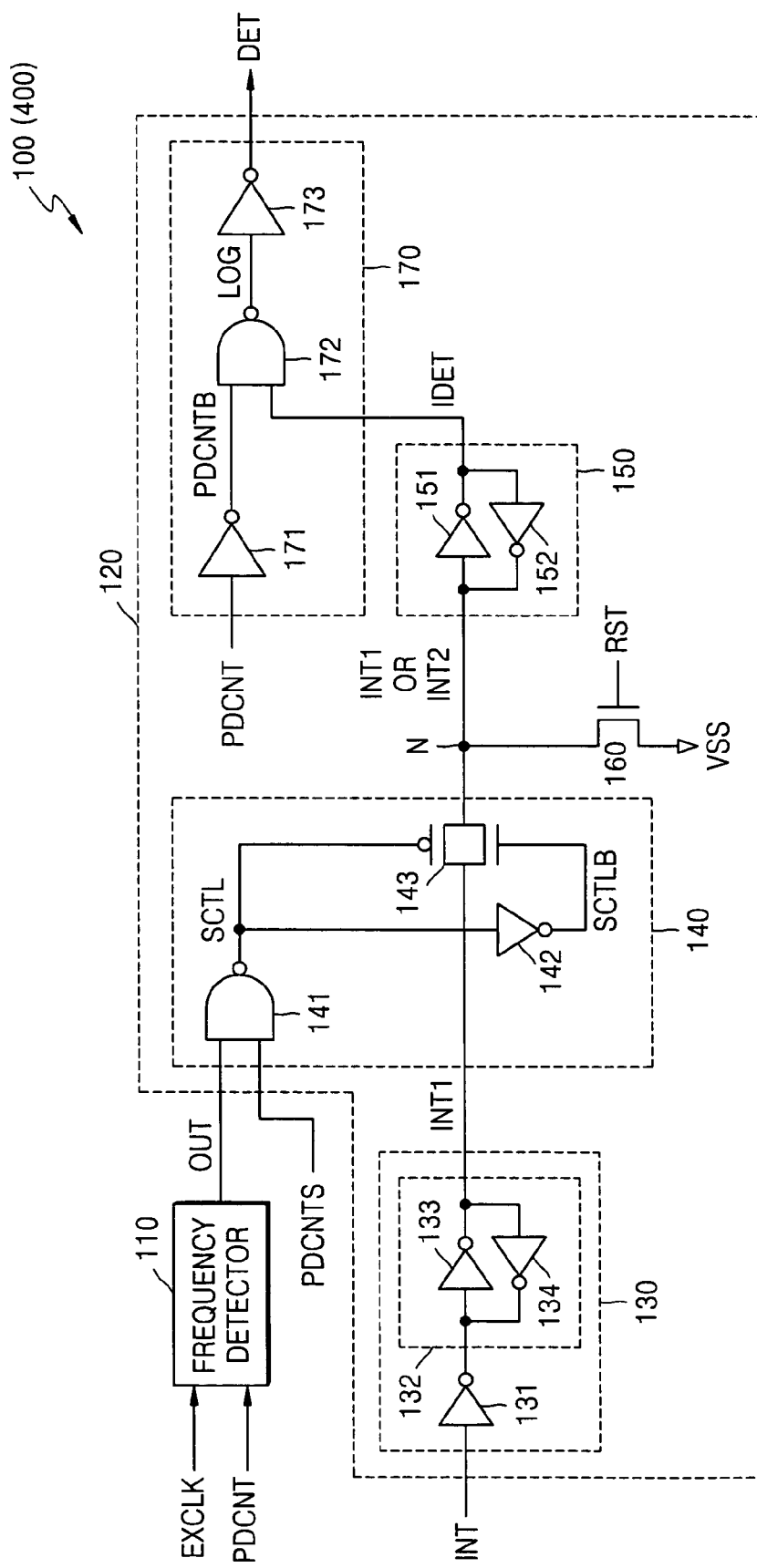
FIG. 4 is a circuit diagram of a frequency detection circuit according to the invention.

FIG. 4 is a circuit diagram of a frequency detection circuit 100 according to the invention.

Referring to FIG. 4, the frequency detection circuit 100 includes a frequency detector 110 and an output controller 120. The frequency detector 110 is enabled or disabled in response to a first detection control signal PDCNT. When the frequency detector 110 is enabled, it detects the frequency of a clock signal EXCLK and outputs a first detection signal OUT. More specifically, when the first detection control signal PDCNT is enabled, the frequency detector 110 is enabled. Thus, the frequency detector 110 divides the clock signal EXCLK by a division ratio and outputs the first detection signal. When the first detection control signal PDCNT is disabled, the frequency detector 110 is disabled. The frequency detector 110 will be described in detail later with reference to FIG. 6.

The output controller 120 includes latch circuits 130 and 150, a switching circuit 140, a pre-discharge circuit 160, and an output circuit 170. The latch circuit 130 includes an inverter 131 and a latch 132, and the latch 132 includes inverters 133 and 134, the output terminals of which are connected to each other's input terminals. The latch circuit 130 latches an internal signal INT and outputs the internal signal INT as a first initial control signal INT1. Preferably, the first initial control signal INT1, i.e., the internal signal INT, remains at an internal voltage (VDD) level.

The switching circuit 140 includes a NAND gate 141, an inverter 142, and a transmission gate 143. The NAND gate 141 outputs a switching control signal SCTL in response to the first detection signal OUT and a second detection control signal PDCNTS. More specifically, when both the first detection signal OUT and the second detection control signal PDCNTS are enabled, the NAND gate 141 enables the switching control signal SCTL. Here, the first detection control signal PDCNT may be a locking control signal that is enabled while a clock signal generator, such as a delay locked loop (DLL), is performing a locking operation. The second detection control signal PDCNTS is a signal that is enabled in response to the first detection control signal PDCNT, and an enabling period of the second detection control signal PDCNTS lies within an enabling period of the first detection control signal PDCNT.

The inverter 142 inverts the switching control signal SCTL and outputs an inverted switching control signal SCTLB. The switching control signal SCTL is input to the gate of a PMOS transistor of the transmission gate 143, and the inverted switching control signal SCTLB is input to the gate of an NMOS transistor of the transmission gate 143. The transmission gate 143 is turned on or off in response to the switching control signal SCTL and the inverted switching control signal SCTLB. When the switching control signal SCTL is disabled, the transmission gate 143 is turned on and outputs the first initial control signal INT1 to a control node N.

The latch circuit 150 includes inverters 151 and 152, the input terminals of which are connected to each other's output terminals. The latch circuit 150 latches either the first initial control signal INT1 or a second initial control signal INT2, which is received from the control node N, and outputs a latched signal IDET.

The pre-discharge circuit 160 is turned on or off in response to a reset signal RST. When the pre-discharge circuit 160 is turned on, it discharges the control node N to a ground voltage VSS to generate the second initial control signal INT2. The pre-discharge circuit 160 may be embodied by an NMOS transistor.

The output circuit 170 includes inverters 171 and 173, and a NAND gate 172. The inverter 171 inverts the first detection control signal PDCNT and outputs an inverted signal. The NAND gate 172 outputs a logic signal LOG in response to the output signal of the inverter 171 and the output signal of the latch circuit 150, and the inverter 173 inverts the logic signal LOG and outputs the inverted signal as a second detection signal DET.

Hereinafter, the operation of the frequency detection circuit 100 shown in FIG. 4 will be described with reference to FIGS. 5A and 5B.

Figure 5A:
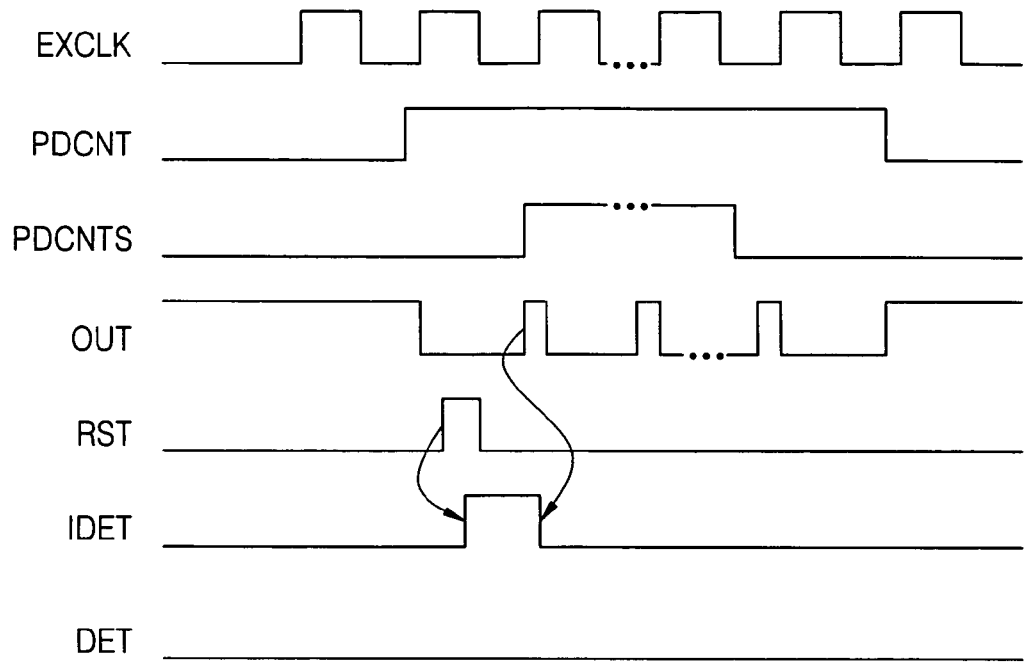
FIGS. 5A and 5B are timing charts showing input and output signals of the frequency detection circuit shown in FIG. 4.

FIG. 5A is a timing chart showing input and output signals of the frequency detection circuit 100 when the frequency of the clock signal EXCLK is lower than a predetermined value.

Referring to FIG. 5A, the first detection control signal PDCNT is enabled for a predetermined time. Once the first detection control signal PDCNT is enabled, the frequency detector 110 detects the frequency of the clock signal EXCLK. When the frequency of the clock signal EXCLK is lower than the predetermined value, the frequency detector 110 outputs the first detection signal OUT in the form of a pulse during an enabling period of the first detection control signal PDCNT. Meanwhile, when the first detection control signal PDCNT is enabled, the reset signal RST remains enabled for a predetermined time and then is disabled. During the enabling period of the reset signal RST, the pre-discharge circuit 160 of the output controller 120 pre-discharges the control node N to a ground VSS level to generate the second initial control signal INT2. The latch circuit 150 latches the second initial control signal INT2 and outputs a latched signal IDET, which is at a high level.

The inverter 171 of the output circuit 170 inverts the first detection control signal PDCNT, at a high level, and outputs an inverted first detection control signal PDCNTB at a low level. The NAND gate 172 outputs a logic signal LOG at a high level in response to the inverted first detection control signal PDCNTB and the output signal of the latch circuit 150. The inverter 173 inverts the logic signal LOG and outputs an inverted signal at a low level as the second detection signal DET.

Thereafter, when the first detection signal OUT is enabled, the switching circuit 140 of the output controller 120 is turned on and outputs the first initial control signal INT1 received from the latch circuit 130 to the control node N. The latch circuit 150 latches the first initial control signal INT1, which is at a high level, and outputs a latched signal IDET at a low level. Here, since the inverted first detection control signal PDCNTB is at a low level, the NAND gate 172 continues to output the logic signal LOG at a high level. Thereafter, if the first detection signal OUT is disabled again, the switching circuit 140 is turned off, and the latch circuit 150 keeps the previously latched first initial control signal INT1. Accordingly, the second detection signal DET is maintained at a low level, which indicates that the frequency of the clock signal EXCLK is lower than the predetermined value.

Figure 5B:
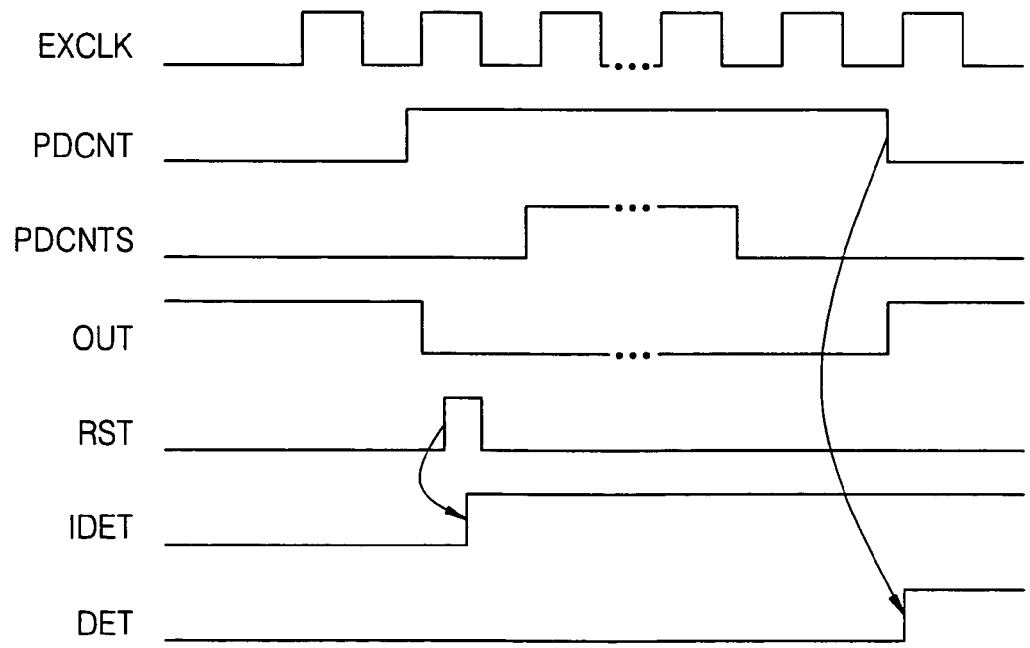

Next, FIG. 5B is a timing chart showing input and output signals of the frequency detection circuit 100 when the frequency of the clock signal EXCLK is higher than the predetermined value.

Referring to FIG. 5B, the first detection control signal PDCNT is enabled for a predetermined time. Once the first detection control signal PDCNT is enabled, the frequency detector 110 detects the frequency of the clock signal EXCLK. When the frequency of the clock signal EXCLK is higher than the predetermined value, the frequency detector 110 outputs the first detection signal OUT at a low level during an enabling period of the first detection control signal PDCNT. Meanwhile, when the first detection control signal PDCNT is enabled, the reset signal RST remains enabled for a predetermined time and then is disabled. During the enabling period of the reset signal RST, the pre-discharge circuit 160 of the output controller 120 pre-discharges the control node N to a ground VSS level to generate the second initial control signal INT2. The latch circuit 150 latches the second initial control signal INT2, which is at a low level, and outputs a latched signal IDET at a high level. Here, since the first detection signal OUT is at a low level, the switching circuit 140 remains turned off and the latch circuit 150 keeps the latched second initial control signal INT2.

The inverter 171 of the output circuit 170 inverts the first detection control signal PDCNT, which is at a high level, and outputs an inverted first detection control signal PDCNTB at a low level. The NAND gate 172 outputs a logic signal LOG, which is at a high level, in response to the inverted first detection control signal PDCNTB and the output signal of the latch circuit 150. The inverter 173 inverts the logic signal LOG and outputs an inverted signal at a low level as the second detection signal DET.

Thereafter, if the first detection control signal PDCNT is disabled to a low level, the inverter 171 inverts the first detection control signal PDCNT and outputs an inverted first detection control signal PDCNTB at a high level. The NAND gate 172 outputs the logic signal LOG at a low level in response to the inverted first detection control signal PDCNTB, which is at the high level, and the output signal of the latch circuit 150, which is at the high level. The inverter 173 inverts the logic signal LOG, which is at a low level, and outputs an inverted signal at a high level as the second detection signal DET. Thereafter, the second detection signal DET is maintained at a high level, which indicates that the frequency of the clock signal EXCLK is higher than the predetermined value.

Figure 6:
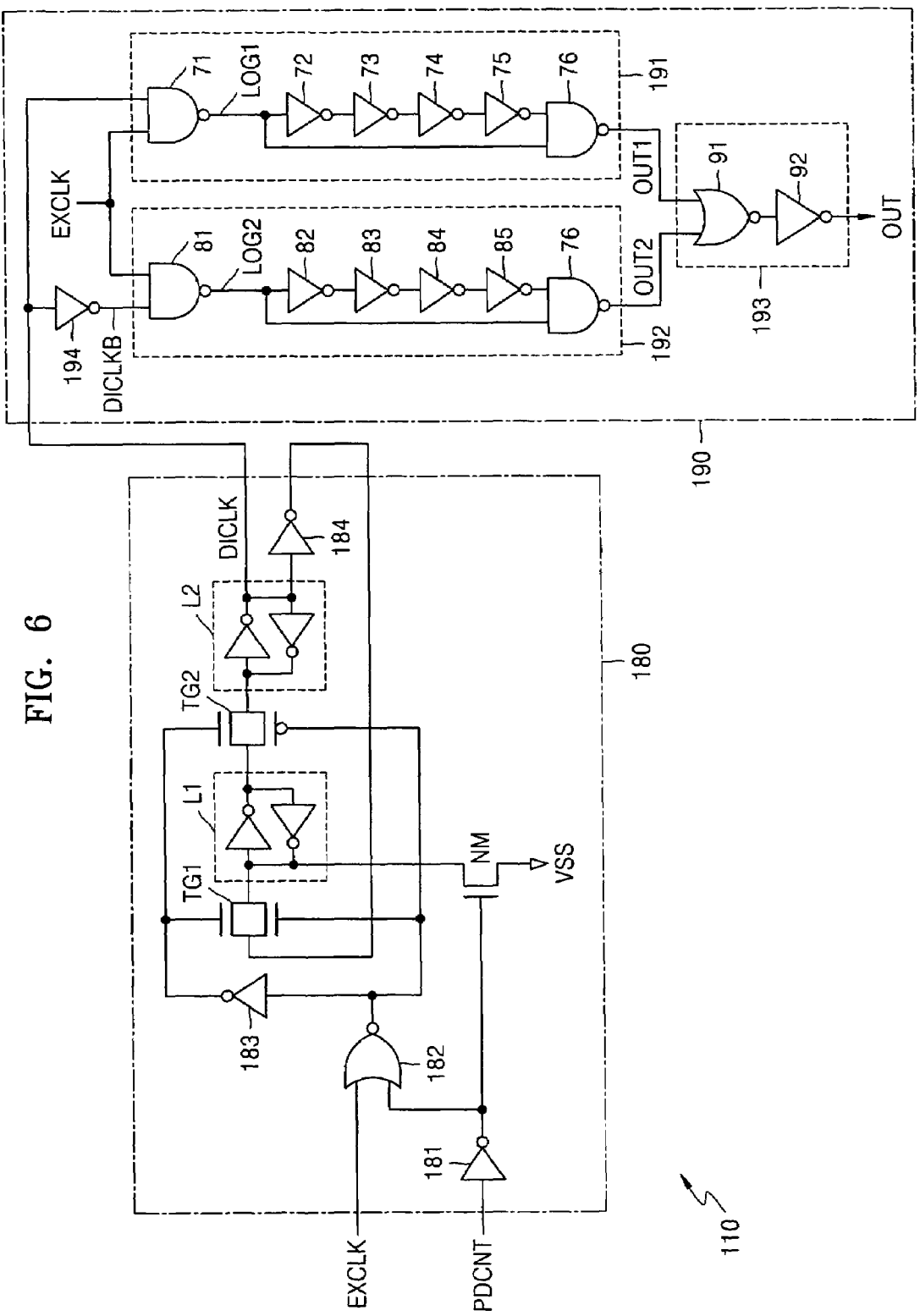
FIG. 6 is a detailed circuit diagram of a frequency detector shown in FIG. 4.

FIG. 6 is a detailed circuit diagram of the frequency detector 110 shown in FIG. 4.

Referring to FIG. 6, the frequency detector 110 includes a divider 180 and a logic circuit 190. The divider 180 includes inverters 181, 183, and 184, a NOR gate 182, transmission gates TG1 and TG2, latch circuits L1 and L2, and an NMOS transistor NM. The divider 180 is enabled or disabled in response to the first detection control signal PDCNT. More specifically, when the first detection control signal PDCNT is enabled, the divider 180 is enabled, and when the first detection control signal PDCNT is disabled, the divider 180 is disabled.

The divider 180, which is enabled, divides the clock signal EXCLK by a division ratio and outputs a divided signal DICLK. In this embodiment the divider 180 divides the clock signal EXCLK by 2. Since the operation of the divider 180 is understood by those skilled in the art, a detailed description thereof will be omitted here.

The logic circuit 190 includes first through third logic circuits 191 to 193 and an inverter 194. The first logic circuit 191 includes NAND gates 71 and 76 and inverters 72 to 75. The inverter 194 inverts the divided signal DICLK and outputs an inverted divided signal DICLKB. The NAND gate 71 outputs a first logic signal LOG1 in response to the divided signal DICLK and the clock signal EXCLK. The inverters 72 to 75, which are connected in series, delay the first logic signal LOG1 for a predetermined time and then output the first logic signal LOG1. The NAND gate 76 outputs a first delay pulse signal OUT1 in response to the first logic signal LOG1 and the output signal of the inverter 75.

The second logic circuit 192 includes NAND gates 81 and 86 and inverters 82 to 85. The NAND gate 81 outputs a second logic signal LOG2 in response to the inverted divided signal DICLKB and the clock signal EXCLK. The inverters 82 to 85, which are connected in series, delay the second logic signal LOG2 for the predetermined time and output the second logic signal LOG2. The NAND gate 86 outputs a second delay pulse signal OUT2 in response to the second logic signal LOG2 and the output signal of the inverter 85.

The third logic circuit 193 includes a NOR gate 91 and an inverter 92. The NOR gate 91 outputs the first detection signal OUT in response to the first delay pulse signal OUT1 and the second delay pulse signal OUT2.

Next, the operation of the frequency detector 110 having the foregoing configuration will be described with reference to FIGS. 7A and 7B.

Figure 7A:
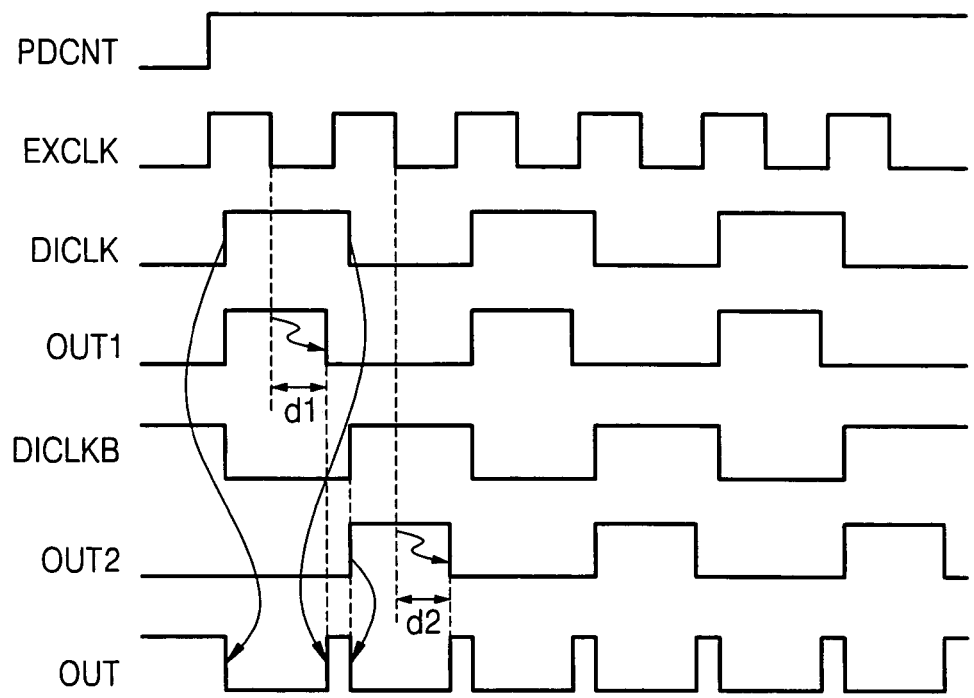
FIGS. 7A and 7B are timing charts showing input and output signals of the frequency detector shown in FIG. 6.

FIG. 7A is a timing chart showing input and output signals of the frequency detector 110 when the frequency of the clock signal EXCLK is lower than the predetermined value.

Referring to FIG. 7A, if the first detection control signal PDCNT is enabled, the divider 180 divides the clock signal EXCLK by 2 and outputs the divided signal DICLK. The divider 180 sequentially outputs the divided signal DICLK during the enabling of the first detection control signal PDCNT. Here, a first cycle of the divided signal DICLK corresponds to a second cycle of the clock signal EXCLK.

The NAND gate 71 of the first logic circuit 191 outputs the first logic signal LOG1 at a low level when both the clock signal EXCLK and the divided signal DICLK are enabled.

The inverters 72 to 75 delay the first logic signal LOG1 for a predetermined time d1 and output the first logic signal LOG1. Here, the predetermined time d1 varies with the number of inverters included in the first logic circuit 191. Thus, the predetermined time d1 can be varied if necessary by changing the number of inverters included in the first logic circuit 191.

The NAND gate 76 outputs the first delay pulse signal OUT1 at a high level in response to the first logic signal LOG1 received from the NAND gate 71 and the output signal of the inverter 75. Thereafter, when the clock signal EXCLK is disabled and the divided signal DICLK remains enabled, the NAND gate 71 outputs the first logic signal LOG1 at a high level. Here, the first logic signal LOG1, which is at the high level, is delayed for the predetermined time d1 by the inverters 72 to 75 and then input to the NAND gate 76. As a result, as shown in FIG. 7A, the NAND gate 76 outputs the first delay pulse signal OUT1 at a low level after the predetermined time d1. The first logic circuit 191 repeats the foregoing operation during the enabling of the first detection control signal PDCNT.

The operation of the second logic circuit 192 is similar to that of the first logic circuit 191. That is, when both the inverted divided signal DICLKB and the clock signal EXCLK are enabled, the second logic circuit 192 outputs the second delay pulse signal OUT2 at a high level. Thereafter, when the clock signal EXCLK is disabled and the inverted divided signal DICLKB remains enabled, the second logic circuit 192 outputs the second delay pulse signal OUT2 at a low level after a time d2 that is predetermined by the inverters 82 to 85. The second logic circuit 192 repeats the foregoing operation during the enabling of the first detection control signal PDCNT. Here, the predetermined time d2 varies with the number of inverters included in the second logic circuit 192. Thus, when the number of inverters included in the second logic circuit 192 is changed, the predetermined time d2 may vary if necessary. Also, the times d1 and d2 are set to be substantially the same value and determine a frequency range of the clock signal EXCLK detected by the frequency detector 110. More specifically, for example, it is assumed that when the times d1 and d2 are both equal to a first value, the frequency detector 110 determines whether or not the frequency of the clock signal EXCLK is higher than a second value. In this case, if the times d1 and d2 are both set to higher than the first value, the frequency detector 110 determines whether or not the frequency of the clock signal EXCLK is higher than a third value. Here, the third value is higher than the second value.

Meanwhile, when the frequency of the clock signal EXCLK is lower than a predetermined value, as shown in FIG. 7A, there is an interval between a falling edge of the first delay pulse signal OUT1 and a rising edge of the second delay pulse signal OUT2 or between a falling edge of the second delay pulse signal OUT2 and a rising edge of the first delay pulse signal OUT1. In this case, the third logic circuit 193 is synchronized with one of the falling edges of the first and second delay pulse signals OUT1 and OUT2 to enable the first detection signal OUT and synchronized with one of the rising edges of the first and second delay pulse signals OUT1 and OUT2 to disable the first detection signal OUT.

Figure 7B:
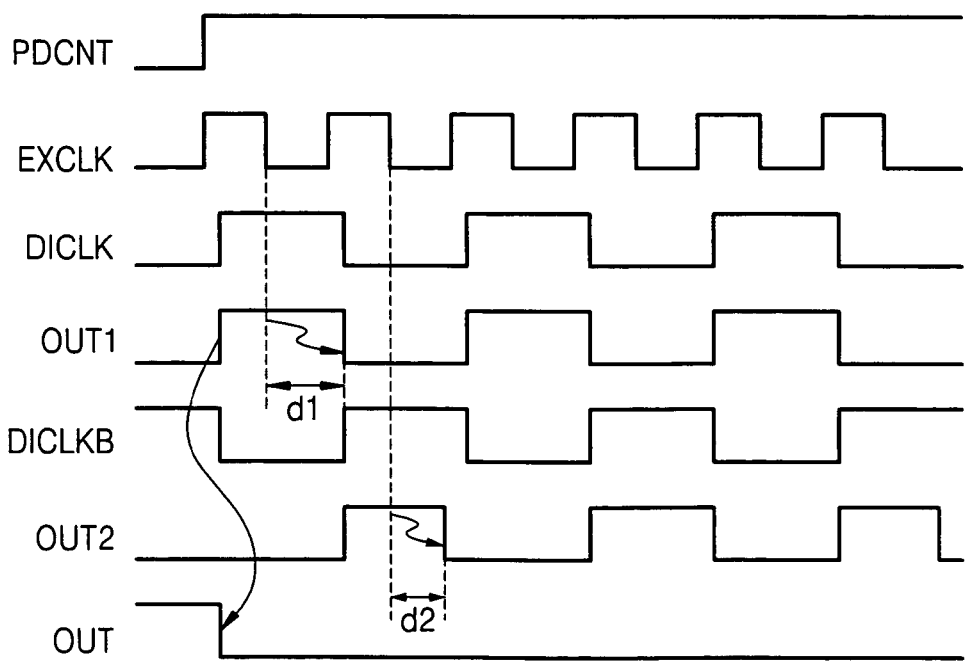

Next, FIG. 7B is a timing chart showing input and output signals of the frequency detector 110 when the frequency of the clock signal EXCLK is higher than a predetermined value. When the frequency of the clock signal EXCLK is higher than the predetermined value, the operation of the frequency detector 110 is substantially the same as described above with reference to FIG. 7A except that there is no interval between a falling edge of the first delay pulse signal OUT1 and a rising edge of the second delay pulse signal OUT2 or between a falling edge of the second delay pulse signal OUT2 and a rising edge of the first delay pulse signal OUT1 as shown in FIG. 7B. In this case, the third logic circuit 193 keeps the first detection signal OUT disabled.

Figure 8:
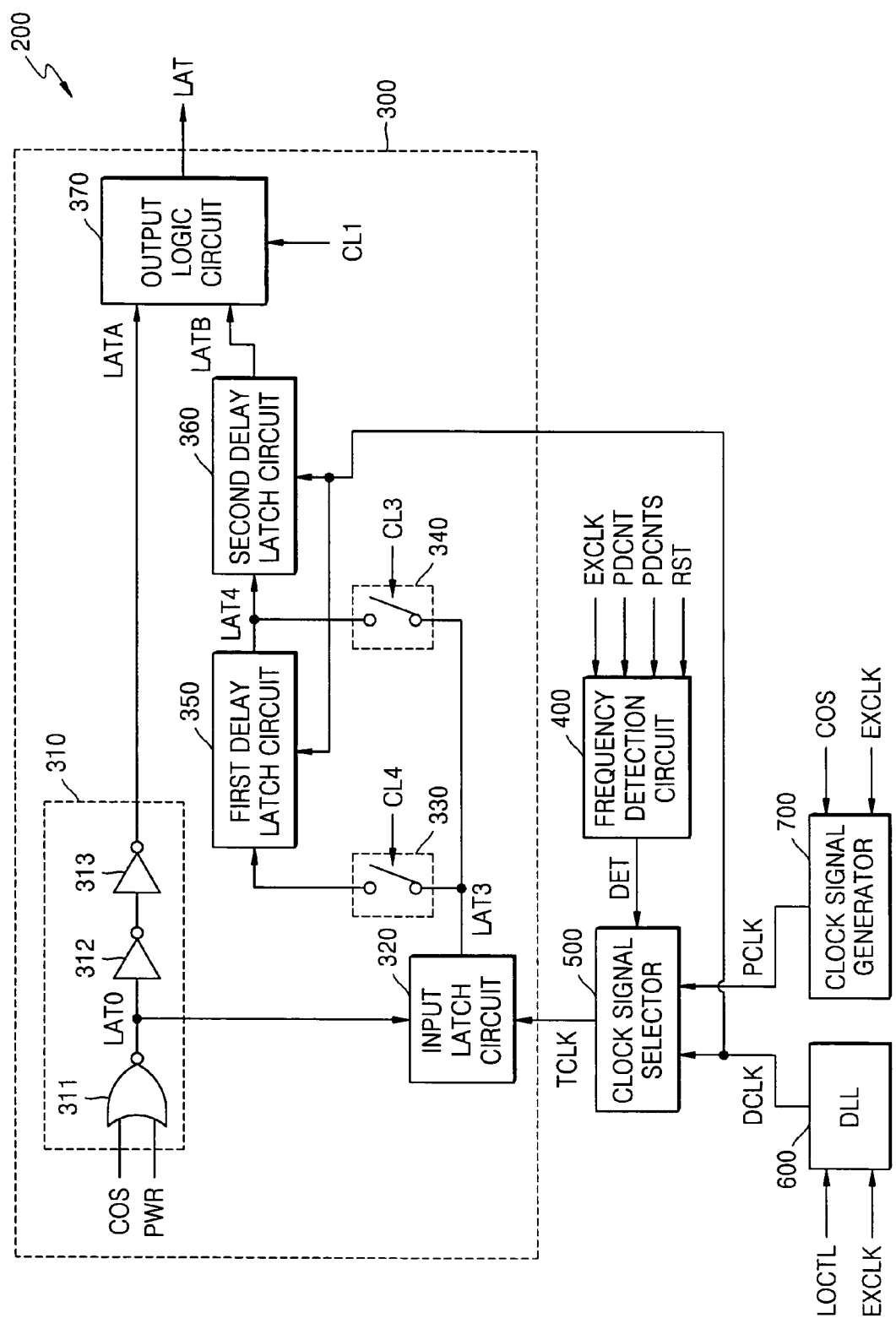
FIG. 8 is a circuit diagram of a latency signal generation circuit according to the invention.

FIG. 8 is a circuit diagram of a latency signal generation circuit 200 according to this embodiment of the invention.

Referring to FIG. 8, the latency signal generation circuit 200 includes a latency signal generator 300, a clock signal selector 500, a frequency detection circuit 400, a DLL 600, and a clock signal generator 700. The latency signal generator 300 includes an input logic circuit 310, an input latch circuit 320, first and second switching circuits 330 and 340, first and second delay latch circuits 350 and 360, and an output logic circuit 370. The numbers of switching circuits and delay latch circuits included in the latency signal generator 300 may vary with a latency number set in a semiconductor memory device including the latency signal generator 300. FIG. 8 illustrates a case where the latency number is 4.

The input logic circuit 310 includes a NOR gate 311 and inverters 312 and 313. The NOR gate 311 outputs a first initial input signal LAT0 in response to a read control signal COS and a write control signal PWR. More specifically, when both the read control signal COS and the write control signal PWR are at a low level, the NOR gate 311 outputs the first initial input signal LAT0 at a high level. The inverters 312 and 313 delay the first initial input signal LAT0 and output the delayed signal as a second initial input signal LATA. The input latch circuit 320 latches the first initial input signal LAT0 in response to an input clock signal TCLK and outputs the latched signal as a first latch signal LAT3.

The first switching circuit 330 is connected between the input latch circuit 320 and the first delay latch circuit 350 and turned on or off in response to a latency control signal CL4. when the first switching circuit 330 is turned on, it outputs the first latch signal LAT3 received from the input latch circuit 320 to the first delay latch circuit 350. The second switching circuit 340 is connected between the input latch circuit 320 and the second delay latch circuit 360 and turned on or off in response to the latency control signal CL3. When the second switching circuit 340 is turned on, it outputs the first latch signal LAT3 received from the input latch circuit 320 to the second delay latch circuit 360.

The first delay latch circuit 350 and the second delay latch circuit 360, which are connected in series, operate in response to a first internal clock signal DCLK. More specifically, when the first switching circuit 330 is turned on, the first delay latch circuit 350 latches the first latch signal LAT3 received from the first switching circuit 330 in response to the first internal clock signal DCLK, and outputs the latched signal as a second latch signal LAT4. Also, when the second switching circuit 340 is turned on, the second delay latch circuit 360 latches the first latch signal LAT3 received from the second switching circuit 340 in response to the first internal clock signal DCLK, and outputs the latched signal as a third latch signal LATB. When the second switching circuit 340 is turned off, the second delay latch circuit 360 latches the second latch signal LAT4 received from the first delay latch circuit 350 in response to the first internal clock signal DCLK, and outputs the latched signal as the third latch signal LATB. The output logic circuit 370 selects one of the second initial input signal LATA and the third latch signal LATB in response to the latency control signal CL1 and outputs the selected signal as a latency signal LAT. Here, since only one of the latency control signals CL1, CL3, and CL4 is enabled in accordance with the set latency number, one of the first and second switching circuits 330 and 340 is turned on or both of them are turned off. Since the operation of the latency signal generator 300 is understood by those skilled in the art, a detailed description thereof will be omitted here.

The frequency detection circuit 400 (100 in FIG. 4) detects the frequency of the external clock signal EXCLK and outputs a second detection signal DET based on the detection result. More specifically, the frequency detection circuit 400 determines whether or not the frequency of the external clock signal EXCLK is higher than a predetermined value in response to first and second detection control signals PDCNT and PDCNTS and a reset signal RST. The first detection control signal PDCNT may be, for example, a locking control signal LOCTL that is enabled while the DLL 600 is performing a locking operation. The locking control signal LOCTL is enabled when the semiconductor memory device including the latency signal generation circuit 200 is enabled, and disabled after a predetermined number of clock cycles (e.g., 200 clock cycles). When the locking control signal LOCTL is disabled, the clock signal generator, such as the DLL 600, finishes the locking operation. The second detection control signal PDCNTS is a signal that is enabled in response to the first detection control signal PDCNT, and an enabling period of the second detection control signal PDCNTS is included in an enabling period of the first detection control signal PDCNT. Thus, after the first detection control signal PDCNT is enabled, the second detection control signal PDCNTS is enabled, and after the second detection control signal PDCNTS is disabled, the first detection control signal PDCNT is disabled.

The frequency detection circuit 400 enables the second detection signal DET when the frequency of the external clock signal EXCLK is higher than the predetermined value, and disables the second detection signal DET when the frequency of the external clock signal EXCLK is lower than the predetermined value. Here, since the configuration and operation of the frequency detection circuit 400 are the same as described above with reference to FIGS. 4 and 5, a description thereof will not be repeated here.

The clock signal selector 500 selects either the first internal clock signal DCLK or the second internal clock signal PCLK in response to the second detection signal DET and outputs the selected signal as an input clock signal TCLK. More specifically, when the second detection signal DET is enabled, the clock signal selector 500 outputs the first internal clock signal DCLK as the input clock signal TCLK. Conversely, when the second detection signal DET is disabled, the clock signal selector 500 outputs the second internal clock PCLK as the input clock signal TCLK.

When the locking control signal LOCTL is enabled, the DLL 600 performs a locking operation based on the external clock signal EXCLK. When the locking control signal LOCTL is disabled, the DLL 600 finishes the locking operation and generates the first internal clock signal DCLK. The clock signal generator 700 generates the second internal clock signal PCLK synchronized with the external clock signal EXCLK only when the semiconductor memory device receives a read command. In other words, the clock signal generator 700 generates the second internal clock signal PCLK during a disabling period of the read control signal COS.

Next, the operation of the latency signal generation circuit 200 will be described. When the first detection control signal PDCNT is enabled, the frequency detection circuit 400 determines whether or not the frequency of the external clock signal EXCLK is higher than a predetermined value. For example, if it is determined that the frequency of the external clock signal EXCLK is higher than the predetermined value, the frequency detection circuit 400 enables the second detection signal DET when the first detection control signal PDCNT is disabled. Here, as long as the first detection control signal PDCNT is not enabled again, the frequency detection circuit 400 keeps the second detection signal DET enabled. In response to the second detection signal DET, the clock signal selector 500 outputs the first internal clock signal DCLK as the input clock signal TCLK. Thereafter, the input latch circuit 320 of the latency signal generator 300 operates in response to the input clock signal TCLK, i.e., the first internal clock signal DCLK.

If it is determined that the frequency of the external clock signal EXCLK is lower than the predetermined value, the frequency detection circuit 400 disables the second detection signal DET when the first detection control signal PDCNT is disabled. Here, as long as the first detection control signal PDCNT is not enabled again, the frequency detection circuit 400 keeps the second detection signal DET disabled. In response to the second detection signal DET, the clock signal selector 500 outputs the second internal clock signal PCLK as the input clock signal TCLK. Here, the input latch circuit 320 operates in response to the input clock signal TCLK, i.e., the second internal clock signal PCLK.

Figure 9:
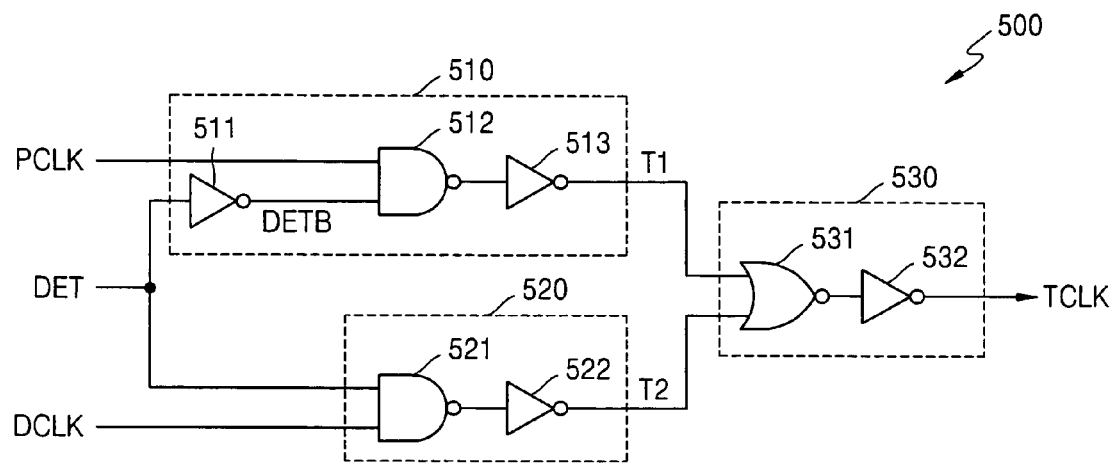
FIG. 9 is a detailed circuit diagram of a clock signal selector shown in FIG. 8.

FIG. 9 is a detailed circuit diagram of the clock signal selector 500 shown in FIG. 8.

Referring to FIG. 9, the clock signal selector 500 includes first through third logic circuits 510 to 530. The first logic circuit 510 includes inverters 511 and 513 and a NAND gate 512. The first logic circuit 510 outputs a first logic signal T1 in response to the second internal clock signal PCLK and the second detection signal DET. More specifically, when the second detection signal DET is disabled, the first logic circuit 510 outputs the second internal clock signal PCLK as the first logic signal T1. While the second detection signal DET is disabled, the first logic circuit 510 keeps the first logic signal T1 at a low level.

The second logic circuit 520 includes a NAND gate 521 and an inverter 522. The second logic circuit 520 outputs a second logic signal T2 in response to the first internal clock signal DCLK and the second detection signal DET. More specifically, when the second detection signal DET is enabled, the second logic circuit 520 outputs the first internal clock signal DCLK as the second logic signal T2. While the second detection signal DET is disabled, the second logic circuit 520 keeps the second logic signal T2 at a low level. The third logic circuit 530 includes a NOR gate 531 and an inverter 532. The third logic circuit 530 outputs the input clock signal TCLK in response to the first and second logic signals T1 and T2. More specifically, once the third logic circuit 530 receives the second internal clock signal PCLK as the first logic signal T1 from the first logic circuit 510, the third logic circuit 530 outputs the second internal clock signal PCLK as the input clock signal TCLK. Also, once the third logic circuit 530 receives the first internal clock signal DCLK as the second logic signal T2 from the second logic circuit 520, the third logic circuit 530 outputs the first internal clock signal DCLK as the input clock signal TCLK.

Figure 10:
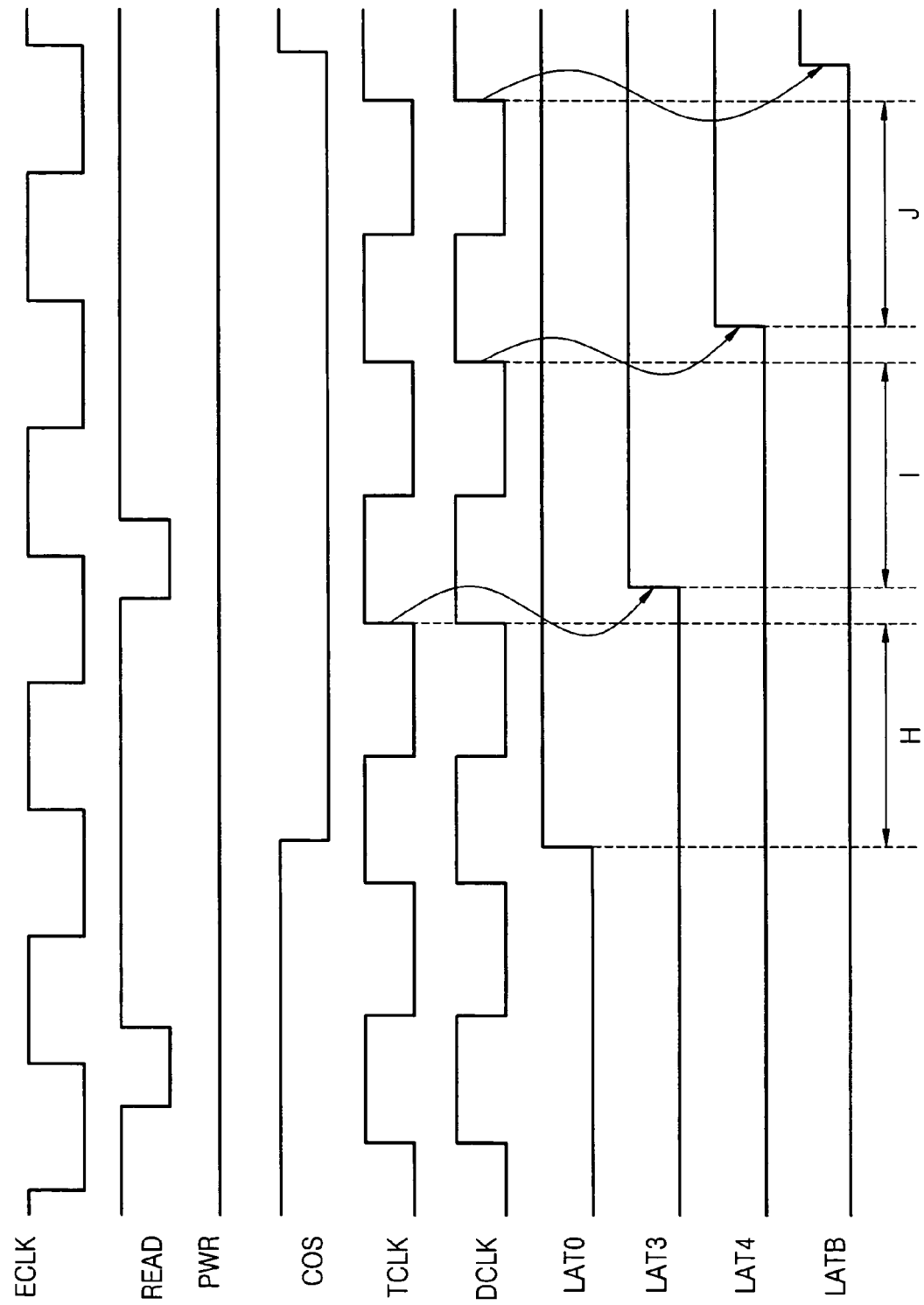
FIG. 10 is a timing chart showing input and output signals of the latency signal generation circuit shown in FIG. 8.

FIG. 10 is a timing chart showing input and output signals of the latency signal generation circuit 200 shown in FIG. 8 in the case where the clock signal selector 500 selects the first internal clock signal DCLK as the input clock signal TCLK.

Referring to FIG. 10, since the input latch circuit 320 of the latency signal generator 300 operates in response to the first internal clock signal DCLK, when the semiconductor memory device receives a read command READ, the input latch circuit 320 can output the first latch signal LAT3 promptly. As a result, a time margin I required from when the first delay latch circuit 350 latches the first latch signal LAT3 until the first delay circuit 350 outputs the second latch signal LAT4 can be kept almost the same as a time margin H or J required for a latch operation of each of the input latch circuit 320 and the second delay latch circuit 360. Accordingly, even if the frequency of the external clock signal EXCLK is high, the latency signal generation circuit 200 can perform a precise operation. Also, when the frequency of the external clock signal EXCLK is low, when the clock signal selector 500 outputs the second internal clock signal PCLK as the input clock signal TCLK, the current used by the latency signal generation circuit 200 can be reduced.

As described above, the frequency detection circuit and method of the embodiments of the invention can detect the frequency of an external clock signal.

In addition, the latency signal generation circuit for the semiconductor memory device including the frequency detection circuit according to the embodiments of the invention can operate precisely when the frequency of the external clock signal is high, and reduce a current to be consumed when the frequency of the external clock signal is low.

While the embodiments of the invention have been particularly shown and described with reference to exemplary embodiments thereof, it will be understood by those of ordinary skill in the art that various changes in form and details may be made therein without departing from the spirit and scope of the embodiments of the invention as defined by the following claims.

What is claimed is:

1. A frequency detection circuit to detect a frequency of a clock signal, the circuit comprising:

a frequency detector to divide the clock signal by a predetermined division ratio, to detect the frequency of the clock signal based on a divided signal obtained by the division of the clock signal, an inverted signal of the divided signal, and the clock signal, and to generate a first detection signal; and an output controller to generate a second detection signal in response to the first detection signal, the second detection signal indicating whether or not the frequency of the clock signal is higher than a predetermined value, wherein the frequency detector comprises:

a divider to divide the clock signal by the predetermined division ratio in response to a first detection control signal and to generate the divided signal, and a logic circuit to generate the first detection signal based on the divided signal, the inverted signal of the divided signal, and the clock signal, and wherein the logic circuit comprises:

a first logic circuit to generate a first delay pulse signal in response to the divided signal and the clock signal, a second logic circuit to generate a second delay pulse signal in response to the inverted signal of the divided signal and the clock signal, and a third logic circuit to generate the first detection signal in response to the first delay pulse signal and the second delay pulse signal.

2. The circuit of claim 1, wherein the frequency detector is enabled or disabled in response to a first detection control signal.

3. The circuit of claim 2, wherein when the first detection control signal is enabled, the frequency detector is enabled, and when the first detection control signal is disabled, the frequency detector is disabled.

4. The circuit of claim 1, wherein the first logic circuit enables the first delay pulse signal when both the divided signal and the clock signal are enabled, and keeps the first delay pulse signal enabled for a predetermined time and then disables the first delay pulse signal when the clock signal is disabled again, and wherein the second logic circuit enables the second delay pulse signal when both the inverted signal of the divided signal and the clock signal are enabled, and keeps the second delay pulse signal enabled for the predetermined time and then disables the second delay pulse signal when the clock signal is disabled again.

5. The circuit of claim 1, wherein the third logic circuit varies a logic level of the first detection signal depending on whether or not there is an interval between a falling edge of the first delay pulse signal and a rising edge of the second delay pulse signal or between a falling edge of the second delay pulse signal and a rising edge of the first delay pulse signal.

6. The circuit of claim 5, wherein when there is an interval between the falling edge of the first delay pulse signal and the rising edge of the second delay pulse signal or between the falling edge of the second delay pulse signal and the rising edge of the first delay pulse signal, the third logic circuit is synchronized with one of the falling edges of the first and the second delay pulse signals to enable the first detection signal, and synchronized with one of the rising edges of the first and the second delay pulse signals to disable the first detection signal.

7. The circuit of claim 5, wherein when there is no interval between the falling edge of the first delay pulse signal and the rising edge of the second delay pulse signal or between the falling edge of the second delay pulse signal and the rising edge of the first delay pulse signal, the third logic circuit keeps the first detection signal disabled.

8. The circuit of claim 1, wherein when the first detection signal is enabled and then disabled repetitively, the output controller determines that the frequency of the clock signal is lower than the predetermined value and keeps the second detection signal disabled, and when the first detection signal remains disabled, the output controller determines that the frequency of the clock signal is higher than the predetermined value and enables the second detection signal.

9. A frequency detection circuit to detect a frequency of a clock signal, the circuit comprising:

a frequency detector to divide the clock signal by a predetermined division ratio, to detect the frequency of the clock signal based on a divided signal obtained by the division of the clock signal, an inverted signal of the divided signal, and the clock signal, and to generate a first detection signal; and an output controller to generate a second detection signal in response to the first detection signal, the second detection signal indicating whether or not the frequency of the clock signal is higher than a predetermined value, wherein the output controller comprises:

a switching circuit to be turned on or off in response to the first detection signal and a second detection control signal and to receive a first initial control signal and to generate the first initial control signal to a control node when the switching circuit is turned on, a first latch circuit to latch either the first initial control signal or a second initial control signal received via the control node, and to generate a latched signal, and an output circuit to generate the second detection signal in response to the first detection control signal and the latched signal.

10. The circuit of claim 9, wherein the output controller further comprises:

a second latch circuit to latch an internal signal and to generate the latched internal signal as the first initial control signal to the switching circuit; and a pre-discharge circuit to pre-discharge the control node to a ground voltage level in response to a reset signal, and to generate the second initial control signal to the first latch circuit.

11. The circuit of claim 9, wherein the first initial control signal is maintained at an internal voltage level, and the second initial control signal is maintained at a ground voltage level.

12. The circuit of claim 9, wherein the switching circuit is turned on only when both the first detection signal and the second detection control signal are enabled.

13. The circuit of claim 9, wherein when the first detection control signal is disabled, if the latched signal is the first initial control signal, the output circuit keeps the second detection signal disabled, and when the first detection control signal is disabled, if the latched signal is the second initial control signal, the output circuit enables the second detection signal and then keeps the second detection signal enabled.

14. The circuit of claim 9, wherein an enabling period of the second detection control signal is included in an enabling period of the first detection control signal.

15. A method of detecting a frequency of a clock signal, the method comprising:

dividing the clock signal by a predetermined division ratio to produce a divided signal;

detecting the frequency of the clock signal based on the divided signal, an inverted signal of the divided signal, and the clock signal to produce a first detection signal;

determining whether the frequency of the clock signal is higher than a predetermined value in response to the first detection signal; and generating a second detection signal indicating whether the frequency of the clock signal is higher than a predetermined value, wherein detecting the frequency comprises:

generating a first delay pulse signal in response to the divided signal and the undivided clock signal, generating a second delay pulse signal in response to the inverted signal of the divided signal and the undivided clock signal, and generating the first detection signal in response to the first delay pulse signal and the second delay pulse signal.

16. The method of claim 15, wherein the dividing the clock signal includes enabling a frequency detector in response to a first detection control signal.

17. The method of claim 15, wherein generating the first delay pulse signal comprises:

enabling the first delay pulse signal when both the divided signal and the clock signal are enabled; and keeping the first delay pulse signal enabled for a predetermined time and then disabling the first delay pulse signal when the clock signal is disabled.

18. The method of claim 15, wherein generating the second delay pulse signal comprises:

enabling the second delay pulse signal when both the inverted signal of the divided signal and the clock signal are enabled; and keeping the second delay pulse signal enabled for a predetermined time and then disabling the second delay pulse signal when the clock signal is disabled.

19. The method of claim 15, wherein generating the first detection signal comprises:

determining whether or not there is an interval between a falling edge of the first delay pulse signal and a rising edge of the second delay pulse signal or between a falling edge of the second delay pulse signal and a rising edge of the first delay pulse signal;

enabling the first detection signal in synchronization with one o F the falling edges of the first and the second delay pulse signals and disabling the first detection signal in synchronization with one of the rising edges of the first and the second delay pulse signals when there is the interval between the falling edge of the first delay pulse signal and the rising edge of the second delay pulse signal or between the falling edge of the second delay pulse signal and the rising edge of the first delay pulse signal; and keeping the first detection signal disabled when there is no interval between the falling edge of the first delay pulse signal and the rising edge of the second delay pulse signal or between the falling edge of the second delay pulse signal and the rising edge of the first delay pulse signal.

20. The method of claim 15, wherein the determining comprises:

determining that the frequency of the clock signal is lower than the predetermined value and keeping the second detection signal disabled when the first detection signal is enabled and then disabled repetitively; and determining that the frequency of the clock signal is higher than the predetermined value and enabling the second detection signal when the first detection signal remains disabled.

21. A method of detecting a frequency of a clock signal, the method comprising:

dividing the clock signal by a predetermined division ratio to produce a divided signal;

detecting the frequency of the clock signal based on the divided signal, an inverted signal of the divided signal, and the clock signal to produce a first detection signal, detecting the frequency signal comprising:

outputting a first delay pulse signal in response to the divided signal and the clock signal;

outputting a second delay pulse signal in response to the inverted signal of the divided signal and the clock signal; and outputting the first detection signal in response to the first delay pulse signal and the second delay pulse signal, outputting the first detection signal comprising:

determining whether or not there is an interval between a falling edge of the first delay pulse signal and a rising edge of the second delay pulse signal or between a falling edge of the second delay pulse signal and a rising edge of the first delay pulse signal;

enabling the first detection signal in synchronization with one of the falling edges of the first and the second delay pulse signals and disabling the first detection signal in synchronization with one of the rising edges of the first and the second delay pulse signals when there is the interval between the falling edge of the first delay pulse signal and the rising edge of the second delay pulse signal or between the falling edge of the second delay pulse signal and the rising edge of the first delay pulse signal; and keeping the first detection signal disabled when there is no interval between the falling edge of the first delay pulse signal and the rising edge of the second delay pulse signal or between the falling edge of the second delay pulse signal and the rising edge of the first delay pulse signal; and determining whether the frequency of the clock signal is higher than a predetermined value in response to the first detection signal and producing a second detection signal as a determination result.

* * * * *

UNITED STATES PATENT AND TRADEMARK OFFICE
CERTIFICATE OF CORRECTION

| | | |
|---|---|---|
| PATENT NO. | : 7,259,595 B2 | Page 1 of 1 |
| APPLICATION NO. | : 11/120804 | |
| DATED | : August 21, 2007 | |
| INVENTOR(S) | : Myeong-O Kim | |

It is certified that error appears in the above-identified patent and that said Letters Patent is hereby corrected as shown below:

Column 15, line 45, the words "o F" should read -- of --.

Signed and Sealed this

Second Day of September, 2008

JON W. DUDAS
*Director of the United States Patent and Trademark Office*